(12) United States Patent
Maurer

(10) Patent No.: US 9,859,868 B2
(45) Date of Patent: Jan. 2, 2018

(54) BAW-FILTER OPERATING USING BULK ACOUSTIC WAVES AND PASSIVE COMPONENTS FORMING A BALUN

(75) Inventor: Gerhard Maurer, Germering (DE)

(73) Assignee: SnapTrack, Inc., San Diego, CA (US)

( * ) Notice: Subject to any disclaimer, the term of this patent is extended or adjusted under 35 U.S.C. 154(b) by 458 days.

(21) Appl. No.: 14/115,328

(22) PCT Filed: May 2, 2012

(86) PCT No.: PCT/EP2012/058028
§ 371 (c)(1),
(2), (4) Date: Feb. 19, 2014

(87) PCT Pub. No.: WO2012/150261
PCT Pub. Date: Nov. 8, 2012

(65) Prior Publication Data
US 2014/0184358 A1    Jul. 3, 2014

(30) Foreign Application Priority Data

May 4, 2011   (DE) .......................... 10 2011 100 468

(51) Int. Cl.
*H03H 9/54*  (2006.01)
*H03H 9/70*  (2006.01)
(Continued)

(52) U.S. Cl.
CPC .............. *H03H 9/542* (2013.01); *H03H 3/02* (2013.01); *H03H 9/0095* (2013.01);
(Continued)

(58) Field of Classification Search
CPC .. H03H 9/0095; H03H 9/0542; H03H 9/0561; H03H 9/0571; H03H 9/542;
(Continued)

(56) References Cited

U.S. PATENT DOCUMENTS 5,194,836 A  * 3/1993 Vale .................. H03H 9/588
                                                   310/320
6,262,637 B1 * 7/2001 Bradley ............. H03H 9/706
                                                   310/322
(Continued)

FOREIGN PATENT DOCUMENTS

DE           10234685 A1    2/2004
DE       102005003834 A1    4/2006
(Continued)

OTHER PUBLICATIONS

H. Zhang et al.; "Radio-Frequency Bulk Acoustic Wave Duplexer with a Differential Receiver Port"; 2010 IEICE Proceedings of Asia-Pacific Microwave Conference (APMC), Dec. 7-10, 2010, pp. 916-919, and 1 page IEEE Xplore abstract.*

(Continued)

*Primary Examiner* — Barbara Summons
(74) *Attorney, Agent, or Firm* — Patterson & Sheridan, L.L.P.

(57) ABSTRACT

The present invention relates to a BAW filter operating with bulk acoustic waves, which has a multilayer construction, wherein functional layers of a BAW resonator operating with bulk acoustic waves are realized by the multilayer construction, and wherein an interconnection of passive components is furthermore formed by the multilayer construction, said interconnection forming a balun, wherein the balun has at least one inductance (L1, L2, L3) and at least one capacitance (C1, C2) which are formed from structured functional layers of the BAW resonator. Furthermore, the invention relates to a method for producing the BAW filter.

16 Claims, 4 Drawing Sheets

(51) Int. Cl.
   *H03H 3/02*   (2006.01)
   *H03H 9/00*   (2006.01)
   *H03H 9/05*   (2006.01)
   *H05K 3/30*   (2006.01)

(52) U.S. Cl.
   CPC ........ *H03H 9/0542* (2013.01); *H03H 9/0571* (2013.01); *H03H 9/706* (2013.01); *H05K 3/30* (2013.01); *H03H 2003/025* (2013.01); *Y10T 29/4913* (2015.01)

(58) Field of Classification Search
   CPC .... H03H 9/706; H03H 3/02; H03H 2003/025; H05K 1/0213; H05K 1/0237; H05K 1/0296; H05K 1/0298; H05K 3/02; H05K 3/06; H05K 3/30; Y10T 29/49002; Y10T 29/49005; Y10T 29/4902; Y10T 29/49071; Y10T 29/4908; Y10T 29/4913; H01L 41/22; H01L 41/27; H01L 41/277; H01L 41/311; H01L 41/314; H01L 41/332
   USPC .......................................... 333/133, 187, 189
   See application file for complete search history.

(56) References Cited

U.S. PATENT DOCUMENTS

| | | | |
|---|---|---|---|
| 6,407,649 B1* | 6/2002 | Tikka | H03H 9/0571 29/25.35 |
| 6,472,954 B1* | 10/2002 | Ruby | H03H 3/04 29/25.35 |
| 6,670,866 B2 | 12/2003 | Ellä et al. | |
| 6,710,681 B2* | 3/2004 | Figueredo | H03H 9/0542 257/531 |
| 6,714,099 B2* | 3/2004 | Hikita | H03H 9/0028 333/133 |
| 6,803,835 B2* | 10/2004 | Frank | H01P 1/20 333/204 |
| 7,084,718 B2* | 8/2006 | Nakamura | H03H 9/02118 333/133 |
| 7,196,596 B2* | 3/2007 | Sul | H03H 7/422 333/187 |
| 7,250,831 B2* | 7/2007 | Song | H03H 3/02 216/17 |
| 7,554,419 B2* | 6/2009 | Inoue | H03H 7/42 333/133 |
| 8,432,236 B2* | 4/2013 | Schmidhammer | H03H 9/0542 333/187 |
| 2002/0021192 A1* | 2/2002 | Klee | H03H 3/02 333/187 |
| 2002/0089393 A1 | 7/2002 | Tikka et al. | |
| 2003/0042992 A1 | 3/2003 | Frank | |
| 2006/0061435 A1 | 3/2006 | Sul | |
| 2006/0244552 A1* | 11/2006 | Park | H03H 9/0542 333/189 |
| 2008/0143457 A1* | 6/2008 | Jhung | H03H 3/02 333/133 |
| 2009/0315636 A1 | 12/2009 | Tamaru | |
| 2010/0117763 A1* | 5/2010 | Suwa | H01P 1/203 333/189 |
| 2011/0316649 A1* | 12/2011 | Link | H03H 9/566 333/133 |

FOREIGN PATENT DOCUMENTS

| | | |
|---|---|---|
| DE | 102005044330 A1 | 3/2007 |
| EP | 1111780 A2 | 6/2001 |
| EP | 1225695 A2 | 7/2002 |
| EP | 1548939 A2 | 6/2005 |
| EP | 1598934 A2 | 11/2005 |
| JP | 2001217675 A | 8/2001 |
| JP | 2002268644 A | 9/2002 |
| JP | 2003338723 A | 11/2003 |
| JP | 2005184851 A | 7/2005 |
| JP | 2006094457 A | 4/2006 |
| JP | 2009025056 A | 2/2009 |
| JP | 2009164482 A | 7/2009 |
| JP | 2010004395 A | 1/2010 |
| JP | 2010050621 A | 3/2010 |
| WO | WO 2010/004534 * | 1/2010 |
| WO | WO 2010/100148 A1 * | 9/2010 |

OTHER PUBLICATIONS

Dongsu, Kim et al.: "A Compact WiMAX Diplexer Module with LTCC and FBAR Technoogies", EuMC 2009, 39th European Microwave Conference, Rom, Italien, 29.09.-Jan. 10, 2009, pp. 567-570.

Bakalski et al.: "Lumped and distributed lattice-type LC-Baluns", IEEE MTT-S International Microwave Symposium Digest, 2002, pp. 209-212.

International Search Report and Written Opinion—PCT/EP2012/058028—ISA/EPO—dated Aug. 30, 2012.

\* cited by examiner

BAW-FILTER OPERATING USING BULK ACOUSTIC WAVES AND PASSIVE COMPONENTS FORMING A BALUN

The present invention relates to a BAW filter operating with bulk acoustic waves (BAW=Bulk Acoustic Wave).

In many transceiver circuits, balanced lines are used in order to eliminate interference signals comprising phase information. Said lines divide the signal in antiphase and subsequently add it. In this case, interference signals which couple in uniformly on both lines cancel one another out since their magnitudes are subtracted from one another. The use of balanced lines is expedient in reception branches, in particular, since low signal strengths are customary here.

In the case of an SAW filter operating with surface acoustic waves (SAW=Surface Acoustic Wave), it is possible to tap off signals with a specified phase angle. This is not readily possible in the case of a BAW filter. However, BAW filter technology affords significant advantages with regard to a higher edge steepness, a smoother useful band characteristic and a lower temperature coefficient. A balun for converting an unbalanced signal into a balanced signal can be connected downstream of a BAW filter having an unbalanced output line.

In order to combine the balun with a filter in a space- and cost-saving manner, solutions are already known wherein a balun and a BAW filter are arranged on a common chip.

U.S. Pat. No. 6,670,866 describes a chip on which a BAW filter and an FBAR balun (FBAR=Film Bulk Acoustic Resonator) are realized. In this case, the FBAR balun has a multilayered and very complicated construction. This multilayered construction comprises two piezoelectric layers, four electrode layers and a dielectric layer.

DE 10 2005 003 834 B4 discloses an FBAR filter which is likewise arranged together with a BAW filter on a single chip and converts an unbalanced input signal into a balanced output signal. In that case, an LCR circuit is realized in a structure having alternately structured metal layers and dielectric layers. DE 10 2005 003 834 B4 additionally describes a production method wherein firstly the BAW filter is formed on a chip substrate. In a next step, a cover above the BAW filter and the LCR circuit are produced simultaneously.

The chips which are known in the prior art and on which a BAW filter is combined with a balun thus have a complicated construction and require very complex production methods. Therefore, the object of the present invention is to provide an improved BAW filter.

This object is achieved by means of a BAW filter comprising the features of claim 1 and by means of a method for producing a BAW filter according to claim 11. Advantageous configurations of the invention are evident from further claims.

The invention proposes a BAW filter operating with bulk acoustic waves, which has a multilayer construction, by which functional layers of a BAW resonator operating with bulk acoustic waves are realized, and wherein an interconnection of passive components is furthermore formed by the multilayer construction, said interconnection forming a balun, wherein the balun has at least one inductance and at least one capacitance which are formed from structured functional layers of the BAW resonator.

Each BAW filter comprises BAW resonators realized by functional layers of a multilayer construction. The present invention is based on the concept of furthermore utilizing said functional layers for realizing a balun. For this purpose, the functional layers can be structured and form passive components. Since, in the BAW filter according to the invention, a BAW resonator and a balun use the same functional layers and can therefore be produced from an identical multilayer construction, the construction of the BAW filter is significantly simplified. It is possible for BAW filter and balun to be structured in parallel and thus simultaneously in a production method.

The balun is integrated into the BAW filter chip and processed and constructed together with the chip, such that the realization of the balun does not give rise to additional complexity in the production method.

Integration of the balun in a common chip with the BAW filter offers a much higher potential for miniaturizing the balun. It is now possible to use, during the production of the balun, methods and techniques which are usually used for chip production, in particular photolithographic patterning.

The functional layers of a BAW resonator can comprise an acoustic mirror, a first electrode, a piezoelectric layer, a second electrode and a trimming layer. The acoustic mirror prevents bulk acoustic waves from emerging from the BAW resonator and penetrating into a substrate on which the BAW resonator is arranged. An acoustic mirror can comprise alternately $SiO_2$ and metal layers, for example.

In one embodiment, two identically constructed mirror layers are arranged below the first electrode. In this case, each mirror layer has a metallization layer embedded between two $SiO_2$ layers.

The trimming layer can be arranged above the second electrode. The trimming layer can be an $SiO_2$ layer. By means of a corresponding choice or modification of the thickness of the trimming layer, the resonant frequency of individual or a plurality of BAW resonators can also be set subsequently, i.e. after completion of the actual resonators.

In one embodiment, the inductance is formed by a spiral metallization which is structured from a metallic functional layer of the BAW filter. The inductance can be realized in a single-layered or multilayered fashion. In this case, the metallization can extend over a plurality of layers of the multilayer construction. In particular the first electrode, the second electrode or the metal layers of the acoustic mirror are suitable for this purpose.

In one embodiment, the capacitances are formed by two structured metal layers which are arranged in two different layers of the multilayer construction and which overlap one another in the multilayer construction. In this case, the capacitances can be formed by structured metal layers in two different layers from the following layers, one or a plurality of metal layers of the acoustic mirror, the first electrodes and the second electrode.

In one embodiment, structured metal layers which form the inductance and structured metal layers which form the capacitance can be arranged at least partly one above another.

In one embodiment, the BAW filter comprises structurally identical BAW resonators which differ merely in the thickness of the trimming layer, wherein the thickness of the trimming layer of one of the BAW resonators is chosen in such a way that the BAW resonator acts as a capacitance. The resonant frequency of the BAW resonator is detuned by a significantly altered thickness of the trimming layer. A BAW resonator that is significantly detuned in terms of its resonant frequency can be used as a capacitance in the balun circuit.

In one embodiment, the balun connects an unbalanced input to two output ports of a balanced output, wherein the balun has a first signal path which connects the unbalanced input to the first balanced output port via a first inductance, a first node, a second inductance and a second node, a second signal path which connects the second node to the second balanced output port via a first capacitance, a third inductance and a third node, and a third signal path which connects the first node to the third node via a second capacitance. This circuit makes it possible to convert an unbalanced input signal into two balanced output signals, which are output at the two output port and which have a phase shift of 180° with respect to one another.

In one embodiment, balun and BAW resonator are arranged alongside one another.

Furthermore, the present invention relates to a method for producing a BAW filter, wherein a multilayer construction is applied on a substrate, wherein functional layers of a BAW resonator are successively applied, wherein layers of the multilayer construction are structured in such a way that they form an interconnection of passive components, which form a balun having at least one inductance and at least one capacitance which are formed from structured functional layers of the BAW resonator.

Since the balun is formed from structured functional layers of the BAW resonator, it is possible, in the production method, to produce balun and BAW resonator simultaneously, that is to say temporally in parallel. As a result, the number of production steps is significantly reduced in comparison with temporally serial production.

The structured metal layers which form the inductance and/or the capacitance can be produced by photolithographic patterning of the functional layers. Photolithographic patterning allows smaller and narrower structures to be produced with high accuracy. The photolithography achieves a patterning by applying, exposing and developing light- or radiation-sensitive resist films and subsequently etching away layers or layer regions that are not covered by a resist structure.

In one embodiment of the production method, an acoustic mirror, a first electrode, a piezoelectric layer, a second electrode and a trimming layer are applied successively on a substrate. In this case, BAW resonator and balun are arranged alongside one another. The acoustic mirror can comprise a plurality of mirror layers which are applied successively. The production of the BAW resonator and of the balun is effected in parallel and differs merely in that in the case of the balun the functional layers of the BAW resonator are structured and/or the thickness of the trimming layer is altered.

A BAW filter according to the invention is suitable, in particular, for use in a duplexer, wherein the BAW filter is integrated together with a further filter operating with acoustic waves on a common chip. The further filter can be a BAW or SAW filter. The BAW filter according to the invention is preferably used in the reception path of the duplexer since a balanced signal routing is advantageous here on account of the lower signal strength.

The invention is explained in greater detail below on the basis of exemplary embodiments and the associated figures. The figures show different exemplary embodiments of the invention on the basis of schematic illustration that is not true to scale.

Figure 1:
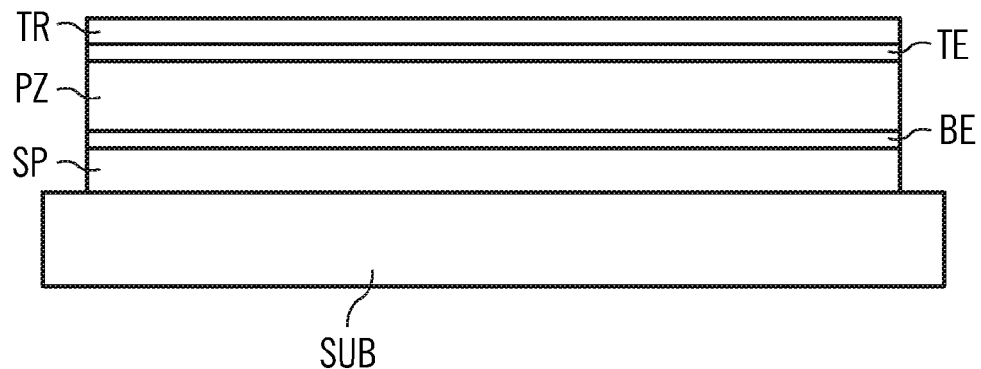
FIG. 1 shows the multilayer construction of a BAW filter.

FIG. 1 schematically shows a BAW filter, which has a multilayer construction arranged on a substrate SUB. The multilayer construction comprises an acoustic mirror SP, a bottom electrode BE, a piezoelectric layer PZ, a top electrode TE and a trimming layer TR.

An alternating signal can be applied to the bottom and top electrodes BE, TE and excites a bulk acoustic wave in the piezoelectric layer PZ. The acoustic mirror SP then prevents said wave from emerging from the BAW resonator and penetrating into the substrate SUB. For this purpose, the acoustic mirror SP comprises alternately layers having relatively high acoustic impedance and layers having relatively low acoustic impedance. Preferably, the acoustic mirror SP can comprise alternately $SiO_2$ and metal layers.

The trimming layer TR can be an $SiO_2$ layer. The resonant frequency of the acoustic resonator is defined by the thickness of the $SiO_2$ trimming layer TR.

The multilayer construction shown in FIG. 1 can be used for forming an acoustic BAW resonator. An interconnection of passive components can furthermore be realized by a structuring according to the invention of the functional layers of the multilayer construction, a balun being formed by said interconnection.

Figure 2:
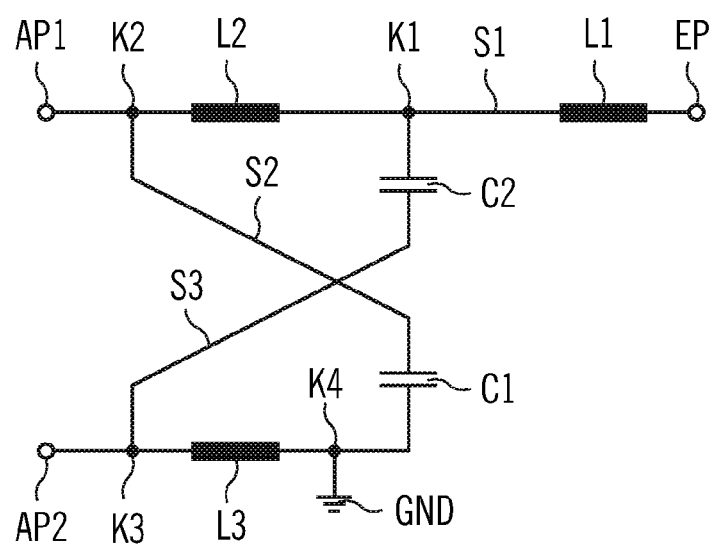
FIG. 2 shows a balun circuit.

FIG. 2 shows an equivalent circuit diagram of the balun realized by structured functional layers of the multilayer construction. The balun has an unbalanced input port EP and two output ports AP1, AP2, which form a balanced output. A signal that is present at the unbalanced input port EP is divided into two signals by the circuit shown in FIG. 2, said signals being output at the balanced output. The two signals are phase-shifted by 180° with respect to one another by the circuit shown in FIG. 2.

The balun has a first signal path S1, which connects the unbalanced input port EP to a first balanced output port AP1. In said first signal path S1, a first inductance L1, a first node K1, a second inductance L2 and a second node K2 are interconnected in series with one another. Furthermore, the balun has a second signal path S2, which connects the second node K2 to the second balanced output port AP2 via a first capacitance C1, a third inductance L3 and a third node K3. In the second signal path S2, a fourth node K4 is furthermore arranged between the first capacitance C1 and the third inductance L3. Via the fourth node K4, the second signal path S2 is interconnected with a reference potential GND. The balun furthermore has a third signal path S3, which connects the first node K1 to the third node K3 via a second capacitance C2.

Figure 3A:
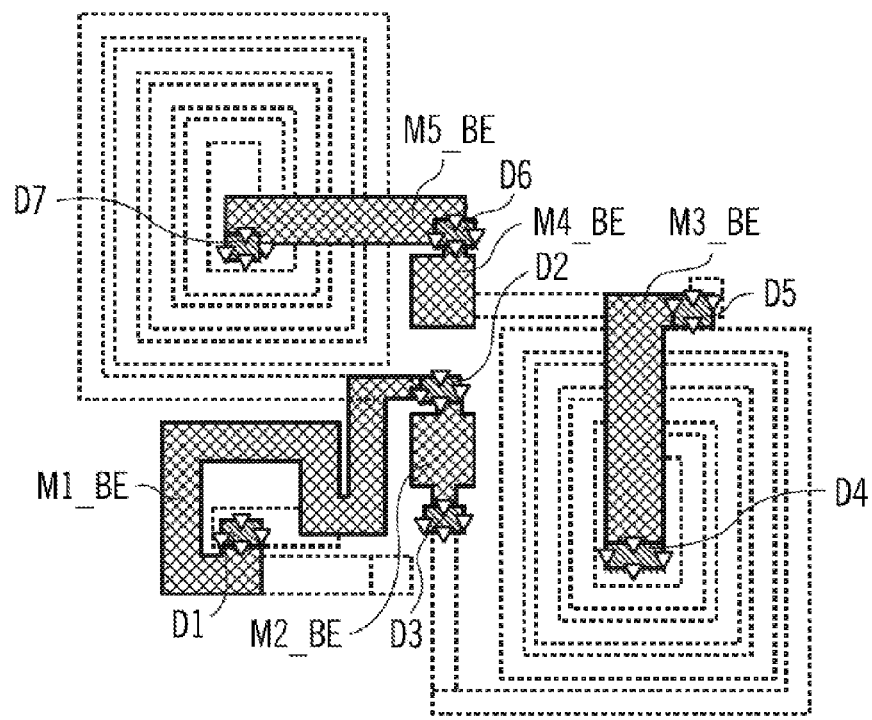
FIG. 3A shows a structured bottom electrode, which is part of a multilayer construction in which the circuit shown in FIG. 2 is realized.
Figure 3B:
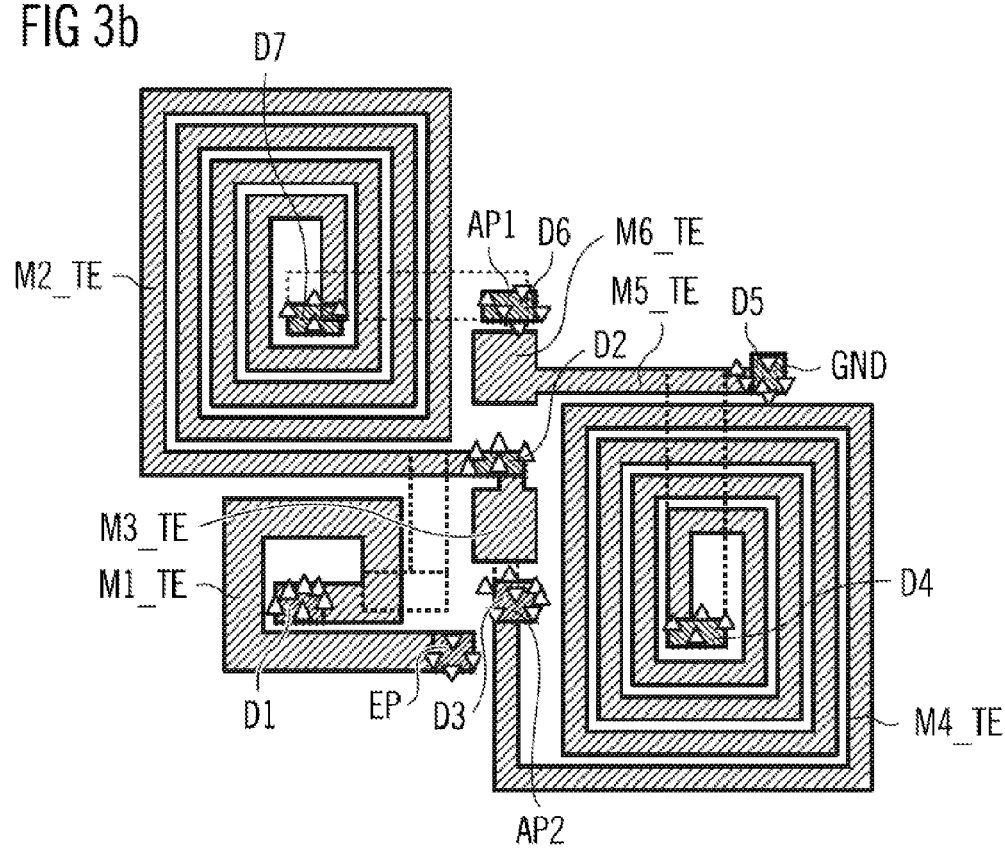
FIG. 3B shows a structured top electrode, which is likewise part of the multilayer construction which realizes the circuit shown in FIG. 2.

FIGS. 3A and 3B then show how the equivalent circuit diagram shown in FIG. 2 can be realized in a multilayer construction. In this case, FIG. 3A shows structured metallizations M1_BE-M5_BE of a bottom electrode BE and FIG. 3B shows structured metallizations M1_TE-M6_TE of a top electrode TE. The metallizations structured from bottom and top electrodes BE, TE are arranged in a common multilayer construction and are connected to one another at the desired locations by means of plated-through holes D1-D7.

The unbalanced input port EP is arranged in the top electrode TE. The unbalanced input port EP is connected to a first spiral metallization M1_TE of the top electrode TE, which partly forms the first inductance L1. The first spiral metallization M1_TE of the top electrode TE is connected to a first spiral metallization M1_BE of the bottom electrode BE via a first plated-through hole D1. The two spiral metallizations M1_TE, M1_BE together form the first inductance L1.

The first spiral metallization M1_BE of the bottom electrode BE is in turn connected to a second plated-through hole D2, which realizes the first node K1. The second plated-through hole D2 is connected in the top electrode TE to a second spiral metallization M2_TE of the top electrode TE, which forms the second inductance L2 in the first signal path.

Furthermore, the second plated-through hole D2 is connected to a rectangular metallization M3_TE in the top electrode, wherein a structurally identical second rectangular metallization M2_BE of the bottom electrode BE is situated opposite said rectangular metallization M3_TE. The two rectangular metallizations M3_TE, M2_BE form a plate capacitor, which forms the capacitance C2 in the third signal path S3.

The rectangular metallization M2_BE in the bottom electrode BE is furthermore connected to a third plated-through hole D3, which connects the rectangular metallization M2_BE in the bottom electrode BE to the top electrode TE. The third plated-through hole D3 constitutes the third node K3. The third plated-through hole D3 is connected firstly to the second balanced output port AP2 and secondly to a fourth spiral metallization M4_TE, which is arranged in the top electrode TE and which forms the third inductance L3 in the signal path S2.

The fourth spiral metallization M4_TE in the top electrode TE is connected to the bottom electrode BE via a fourth plated-through hole D4. In the bottom electrode BE, the fourth plated-through hole D4 is connected to a third metallization M3_BE. The third metallization M3_BE of the bottom electrode BE is in turn connected to a fifth metallization M5_TE of the top electrode TE via a fifth plated-through hole D5.

The fifth metallization M5_TE of the top electrode TE is connected via a further connection to a reference potential GND and to a sixth rectangular metallization M6_TE of the top electrode. In the bottom electrode BE, a structurally identical fourth rectangular metallization M4_BE is situated opposite said rectangular metallization M6_TE. The two rectangular metallizations M6_TE, M4_BE form the first capacitance C1 in the signal path S2.

The fourth rectangular metallization M4_BE of the bottom electrode BE is connected to a sixth plated-through hole D6, which connects the bottom electrode BE to the top electrode TE. The sixth plated-through hole D6 forms the first balanced output port AP in the top electrode TE.

Moreover, the fourth metallization M4_BE in the bottom electrode BE is connected to a seventh plated-through hole D7 via a fifth metallization M5_BE. The seventh plated-through hole D7 connects the bottom electrode BE to the second metallization M2_TE of the top electrode TE. The second metallization M2_TE in turn forms the second inductance L2.

The realization of the balun circuit in a multilayer construction as described here constitutes only one possible configuration of the invention.

Inductances L1, L2, L3 are realized by spiral metallizations M1_TE, M1_BE, M2_TE, M4_TE in one or a plurality of layers of the multilayer construction. Capacitances C1, C2 are formed by planar metallizations M2_BE, M3_TE, M6_TE, M4_BE which are arranged in two different layers of the multilayer construction and are situated opposite one another.

FIGS. 4 to 7 are based on a duplexer comprising a BAW filter according to the invention. In this case, the BAW filter according to the invention is arranged in the reception path of the duplexer. A conventional BAW filter is used in the transmission path of the duplexer.

Figure 4:
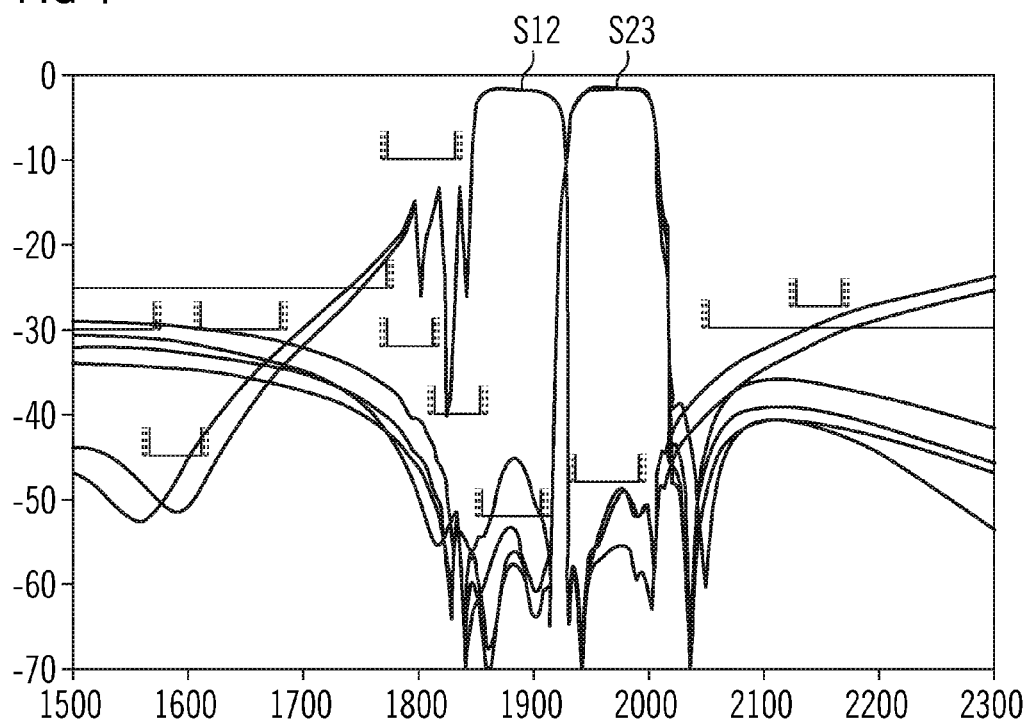
FIG. 4 shows the insertion losses S12, S23 of a BAW duplexer according to the invention.

FIG. 4 shows the insertion losses S12 and S23 as a function of the frequency for a BAW duplexer. The frequency in MHz is plotted on the abscissa, and the attenuation in dB is plotted on the ordinate.

The curve S12 describes the insertion loss of a TX filter, i.e. the transmission from a transmission port to the antenna port as a function of the frequency of the signal. The curve S23 describes the insertion loss of the RX filter, i.e. the transmission from the antenna port to a reception port as a function of the frequency of the signal.

In FIG. 4, and in the following figures, the curves S12, S23 are plotted multiply. In this case, a first curve is based on a duplexer having ideal components, a second curve is based on a duplexer having partly ideal and partly real components, and a third curve is based on a duplexer having real components.

Figure 5:
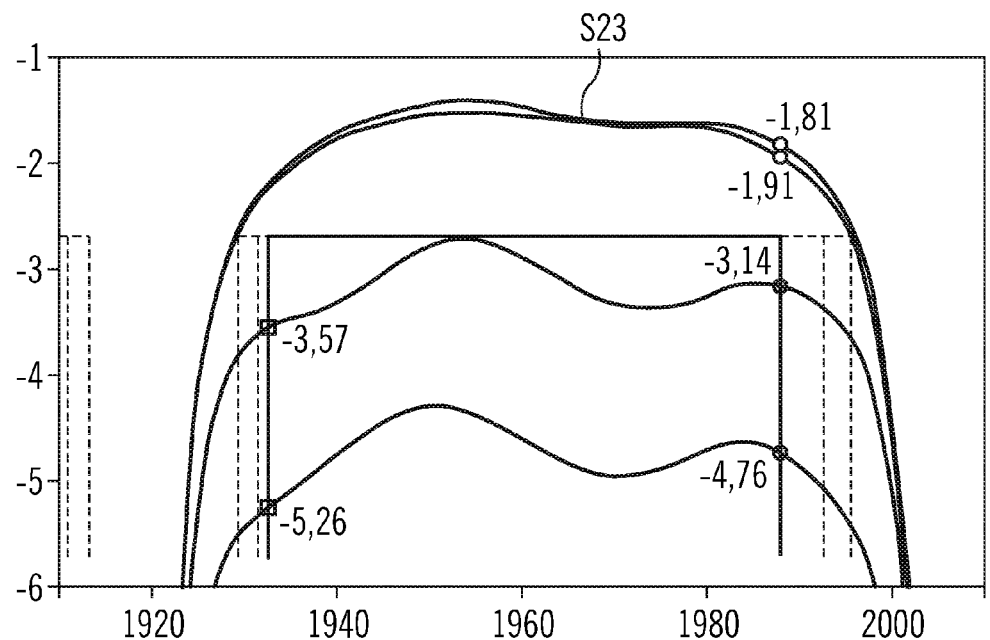
FIG. 5 shows an excerpt from the curves shown in FIG. 4.

FIG. 5 shows an excerpt from the curve S23 shown in FIG. 4.

Figure 6:
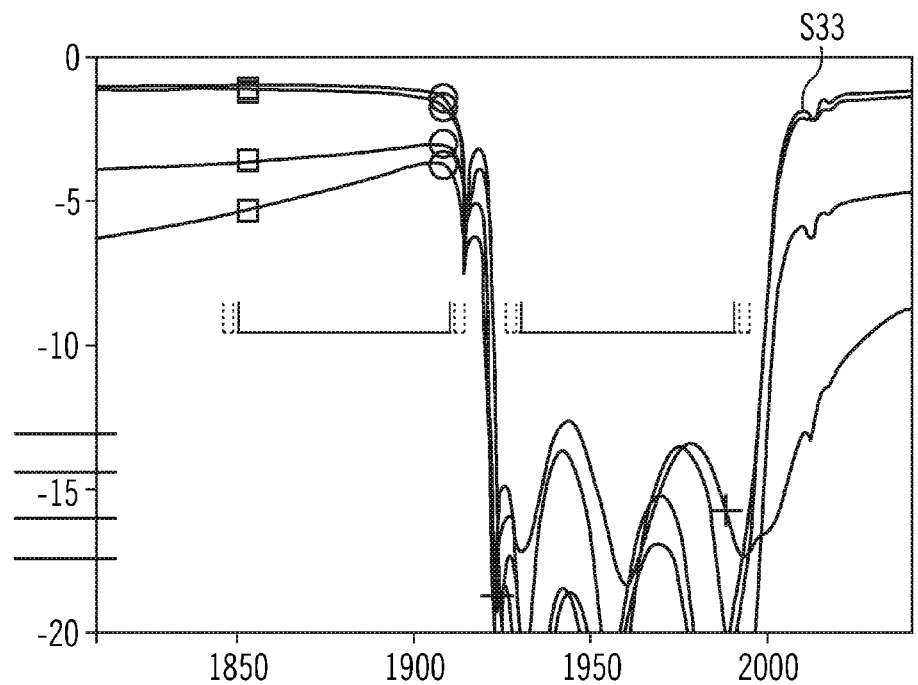
FIG. 6 shows the reflection factor S33 at the reception port of a BAW duplexer according to the invention.

FIG. 6 shows the reflection factor at the reception port described by the curve S33. The frequency in MHz is plotted on the abscissa and the attenuation in dB is plotted on the ordinate.

Figure 7:
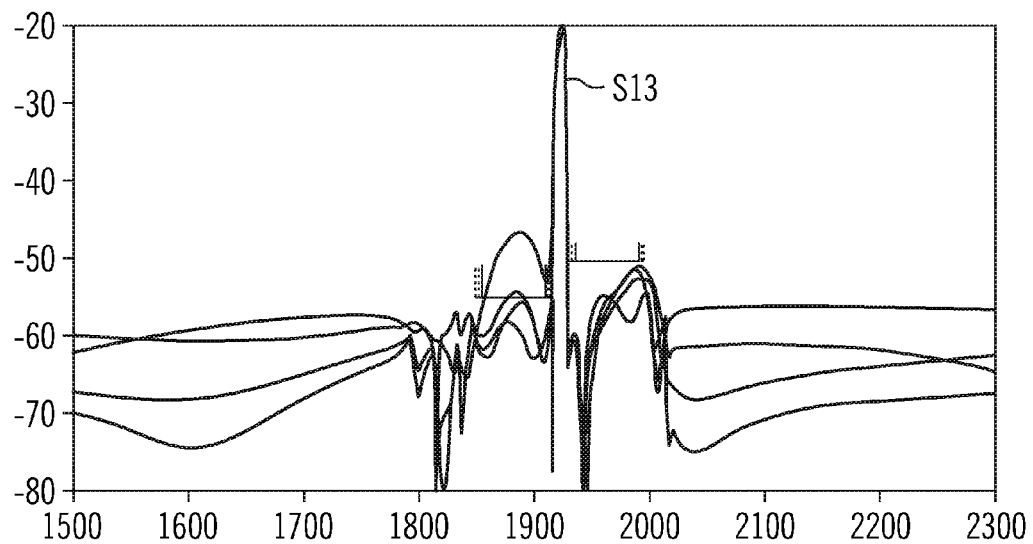
FIG. 7 shows the isolation of a BAW duplexer according to the invention.

FIG. 7 shows a curve S13 describing the isolation between a transmission port and a reception port in a BAW duplexer. The frequency in MHz is plotted on the abscissa, and the attenuation in dB is plotted on the ordinate.

REFERENCE SIGNS

SUB—Substrate
SP—Acoustic mirror
BE—Bottom electrode
PZ—Piezoelectric layer
TE—Top electrode
TR—Trimming layer
EP—Input port
AP1, AP2—Output port
S1-S3—Signal path
L1-L3—Inductance
K1-K4—Node
C1, C2—Capacitance
GND—Reference potential
M1_TE-M6_TE—Metallization of the top electrode
M1_BE-M5_BE—Metallization of the bottom electrode
D1-D7—Plated-through hole
S12—Insertion loss of the Tx filter
S23—Insertion loss of the Rx filter
S33—Reflection factor of the reception port
S13—Isolation

What is claimed is:
1. A bulk acoustic wave (BAW) filter, comprising:
a multilayer construction,
wherein functional layers of a single BAW resonator operating with bulk acoustic waves are realized by the multilayer construction, and
wherein an interconnection of passive components is furthermore formed by the multilayer construction, said interconnection forming a balun, wherein the balun has at least one inductance and at least one capacitance which are formed from structured functional layers of the single BAW resonator, and wherein structured metal layers which form the inductance and structured metal layers which form the capacitance are arranged at least partly one above another.

2. The BAW filter according to claim 1, wherein the functional layers of the single BAW resonator comprise an acoustic mirror, a first electrode a piezoelectric layer, a second electrode and a trimming layer.

3. The BAW filter according to claim 2, wherein the inductance is formed by one or a plurality of metal layers of the acoustic mirror and/or a metal layer of the first electrode and/or a metal layer of the second electrode.

4. The BAW filter according to one of claims 1 to 3, wherein the inductance is formed by a spiral metallization which is structured from a metallic functional layer of the BAW filter.

5. The BAW filter according to claim 2, further comprising:
structurally identical BAW resonators except that they differ in thickness of the trimming layer, wherein the thickness of the trimming layer of one of the BAW resonators is chosen in such a way that the BAW resonator acts as a capacitance.

6. The BAW filter according to claim 2, wherein the capacitance is formed by structured metal layers in two different layers from the following layers, one or a plurality of metal layers of the acoustic mirror, a metal layer of the first electrode and a metal layer of the second electrode.

7. The BAW filter according to claim 1, wherein the capacitance is formed by two structured metal layers which are arranged in two different layers of the multilayer construction and which overlap one another in the multilayer construction.

8. A duplexer, wherein a BAW filter according to claim 1 and a further filter operating with acoustic waves are arranged on a common chip.

9. The BAW filter according to claim 1, wherein the balun connects an unbalanced input to two output ports of a balanced output, wherein the balun has a first signal path which connects the unbalanced input to the first balanced output port via a first inductance, a first node, a second inductance and a second node, a second signal path which connects the second node to the second balanced output port via a first capacitance, a third inductance and a third node, and a third signal path which connects the first node to the third node via a second capacitance.

10. The BAW filter according to claim 1, wherein the balun and the single BAW resonator are arranged alongside one another.

11. A method for producing a bulk acoustic wave (BAW) filter, comprising:
applying a multilayer construction on a substrate,
wherein functional layers of a single BAW resonator are successively applied and structured, and
wherein layers of the multilayer construction are structured in such a way that they form an interconnection of passive components, which forms a balun having at least one inductance and at least one capacitance which are formed from structured functional layers of the single BAW resonator, wherein structured metal layers which form the inductance and structured metal layers which form the capacitance are arranged at least partly one above another.

12. The method according to claim 11, wherein structured metal layers which form the inductance and/or the capacitance are produced by photolithographic patterning.

13. The method according to claim 11 or 12, wherein an acoustic mirror, a first electrode, a piezoelectric layer, a second electrode and a trimming layer are applied successively on the substrate.

14. The method according to claim 11, wherein the single BAW resonator and the balun are structured temporally in parallel.

15. A BAW filter with bulk acoustic waves, comprising:
a multilayer construction,
wherein functional layers of a BAW resonator operating with bulk acoustic waves are realized by the multilayer construction,
wherein an interconnection of passive components is furthermore formed by the multilayer construction, said interconnection forming a balun, wherein the balun has at least one inductance and at least one capacitance which are formed from structured functional layers of the BAW resonator, and
wherein structured metal layers which form the inductance and structured metal layers which form the capacitance are arranged at least partly one above another.

16. A bulk acoustic wave (BAW) filter, comprising:
a multilayer construction,
wherein functional layers of a BAW resonator operating with bulk acoustic waves are realized by the multilayer construction, and
wherein an interconnection of passive components is furthermore formed by multilayer construction, said interconnection forming a balun,
wherein the balun has at least one inductance and at least one capacitance which are formed from structured functional layers of the BAW resonator,
wherein the balun connects an unbalanced input to two output ports of a balanced output, and
wherein the balun has a first signal path which connects the unbalanced input to the first balanced output port via a first inductance, a first node, a second inductance and a second node, a second signal path which connects the second node to the second balanced output port via a first capacitance, a third inductance and a third node, and a third signal path which connects the first node to the third node via a second capacitance.

* * * * *